(12) United States Patent
Gaewsky et al.

(10) Patent No.: US 12,379,989 B2
(45) Date of Patent: Aug. 5, 2025

(54) ZERO VOLTAGE PROGRAM STATE DETECTION

(71) Applicant: Intel NDTM US LLC, Santa Clara, CA (US)

(72) Inventors: Kristopher H. Gaewsky, El Dorado Hills, CA (US); Kevin K. Liou, Rancho Cordova, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 0 days.

(21) Appl. No.: 18/123,946

(22) Filed: Mar. 20, 2023

(65) Prior Publication Data

US 2023/0229553 A1 Jul. 20, 2023

(51) Int. Cl.
*G06F 11/10* (2006.01)
*G06F 3/06* (2006.01)

(52) U.S. Cl.
CPC ........ *G06F 11/1048* (2013.01); *G06F 3/0619* (2013.01); *G06F 11/1072* (2013.01)

(58) Field of Classification Search
CPC . G06F 11/1048; G06F 3/0619; G06F 11/1072
See application file for complete search history.

(56) References Cited

U.S. PATENT DOCUMENTS

| | | | | |
|---|---|---|---|---|
| 2009/0168541 A1* | 7/2009 | Eguchi | ................... | G11C 29/50 365/201 |
| 2013/0176032 A1* | 7/2013 | Zimmanck | ........... | G01R 31/327 324/415 |
| 2014/0133225 A1* | 5/2014 | Zeng | ................... | G11C 16/3422 365/185.03 |
| 2014/0372666 A1* | 12/2014 | Moioli | ................. | G11C 7/1045 711/103 |
| 2019/0355431 A1* | 11/2019 | Madraswala | ...... | G11C 16/3459 |
| 2020/0250028 A1* | 8/2020 | Vittal Prabhu | ....... | G06F 11/076 |

OTHER PUBLICATIONS

Intel Corporation, et al., "Open NAND Flash Interface Specification", Revision 5.1, May 3, 2022, namely Section 5.29. Set Features Definition, pp. 307-310, 9 pages, [retrieved on Mar. 20, 2023], retrieved from: https://media-www.micron.com/-/media/client/onfi/specs/onfi_5_1_final_1,-d-,0.pdf?la=en&rev=27ed5d740c8543f8bba06dbbd56fe6fe.

* cited by examiner

*Primary Examiner* — Mark D Featherstone
*Assistant Examiner* — Jeffrey Andrew Yang
(74) *Attorney, Agent, or Firm* — Morgan, Lewis & Bockius LLP (57) ABSTRACT

For NAND devices having a zero voltage program state as a result of a preconditioning operation, detecting the status of the zero voltage program state is important for customers to quickly validate their component and SSD flows to improve NAND retention and reliability after assembly and die level re-work. A zero voltage program state detection operation quickly determines the validity of the zero voltage program state of a NAND page of a NAND device. The detection operation includes reading a NAND page with reference voltages that delimit a predetermined acceptable range of voltage levels below and above a zero threshold voltage. If NAND memory cells having threshold voltage levels that fall below or above the acceptable voltage levels exceed a predetermined failed bytes limit for the NAND page, the zero voltage program state is invalid.

20 Claims, 8 Drawing Sheets

600 – EXAMPLE COMMAND SET FEATURE 86h PARAMETERS

| Subfeature Parameter | Options | DQ7 | DQ6 | DQ5 | DQ4 | DQ3 | DQ2 | DQ1 | DQ0 | Value |
|---|---|---|---|---|---|---|---|---|---|---|
| P2 | | | | | | | | | | |
| Zero Vt Mode | Disabled (default) | | | | | | 0 | 0 | 0 | 0b |
| | Program Mode | | | | | | 0 | 0 | 1 | 1b |
| | Read Mode (Low) | | | | | | 0 | 1 | 1 | |
| | Read Mode (High) | | | | | | 1 | 0 | 1 | |

ZERO VOLTAGE PROGRAM STATE DETECTION

FIELD OF THE INVENTION

This disclosure relates to non-volatile computer memory and, more particularly, to improving reliability of NAND memory.

BACKGROUND OF THE INVENTION

Non-volatile memory refers to computer memory in which data can be stored even when powered off. Flash memory, such as NAND memory, is a type of transistor-based non-volatile memory composed of an array of memory cells to store data. Each memory cell has a state that is determinate even if power is interrupted to the device in which they are contained. Devices containing flash memory include, among others, storage devices such as a solid-state drive (SSD) and a Universal Serial Bus (USB) flash drive that use integrated circuitry to store and access data in NAND memory.

The term NAND memory includes three-dimensional (3D) NAND memory in which integrated circuit NAND memory is stacked vertically to form a 3D NAND memory chip. Newer NAND memories can include higher density memory cells capable of storing multiple bits of data per cell.

While the architectural changes introduced in 3D NAND memory chips and higher density memory cells enable the development of memory and storage devices with greater capacity, they can also cause increased error rates as compared to previous generations of devices. Because memory and storage devices are physical objects whose properties change over time or vary from device to device, care is taken to provide operating conditions such as voltage or current levels that reduce error rates and improve the reliability of NAND memory.

BRIEF DESCRIPTION OF THE DRAWINGS

The described embodiments are illustrated by way of example and not limitation in the figures of the accompanying drawings, in which like references indicate similar elements and in which.

Other features of the described embodiments will be apparent from the accompanying drawings and from the detailed description that follows.

DETAILED DESCRIPTION

Among the types of errors that occur in NAND memory are retention errors. Retention errors are the result of charge leaking out of the transistors over time. Placing NAND memory cells in a zero voltage program state prior to programming has been shown to increase the long-term quality of NAND media by increasing endurance and data retention. For this reason, customers are instructed to cause the host to perform a series of commands to program NAND arrays prior to proceeding with a customer's component manufacturing flows, such as SSD build and SSD re-work, or other types of customer components. The sequence of commands to program the NAND arrays is complex, causing the NAND device to be erased across all decks and forced internally to be programmed to all zero values, referred to as preconditioning the NAND device. The zero voltage program state that results is considered to be a neutral state less prone to leakage.

Once the NAND device is preconditioned, there is no easy way to determine whether the zero voltage program state has been achieved and/or is still in effect, short of repeating the complex series of commands to precondition the NAND device. Repeating the preconditioning is undesirable due to the complexity of the program operations and the resulting wear and tear from the program/erase operations involved.

To address this problem, embodiments of zero voltage program state detection provide the ability to quickly determine a pass or fail status of the zero voltage program state of a page of a NAND device based on, among other actions, reading the NAND pages of the NAND device with reference voltages that delimit a predetermined acceptable range of voltage levels below and above the zero threshold voltage and comparing the results to a predetermined failure tolerance threshold. This enables customers to quickly validate their component and SSD flows to ensure that the zero voltage program state is correct, and the NAND array is in the proper state, thereby improving NAND retention and reliability after assembly and die level re-work.

The following detailed description of the drawings that follow includes non-limiting examples of embodiments of zero voltage program state detection for NAND memory.

Figure 1:
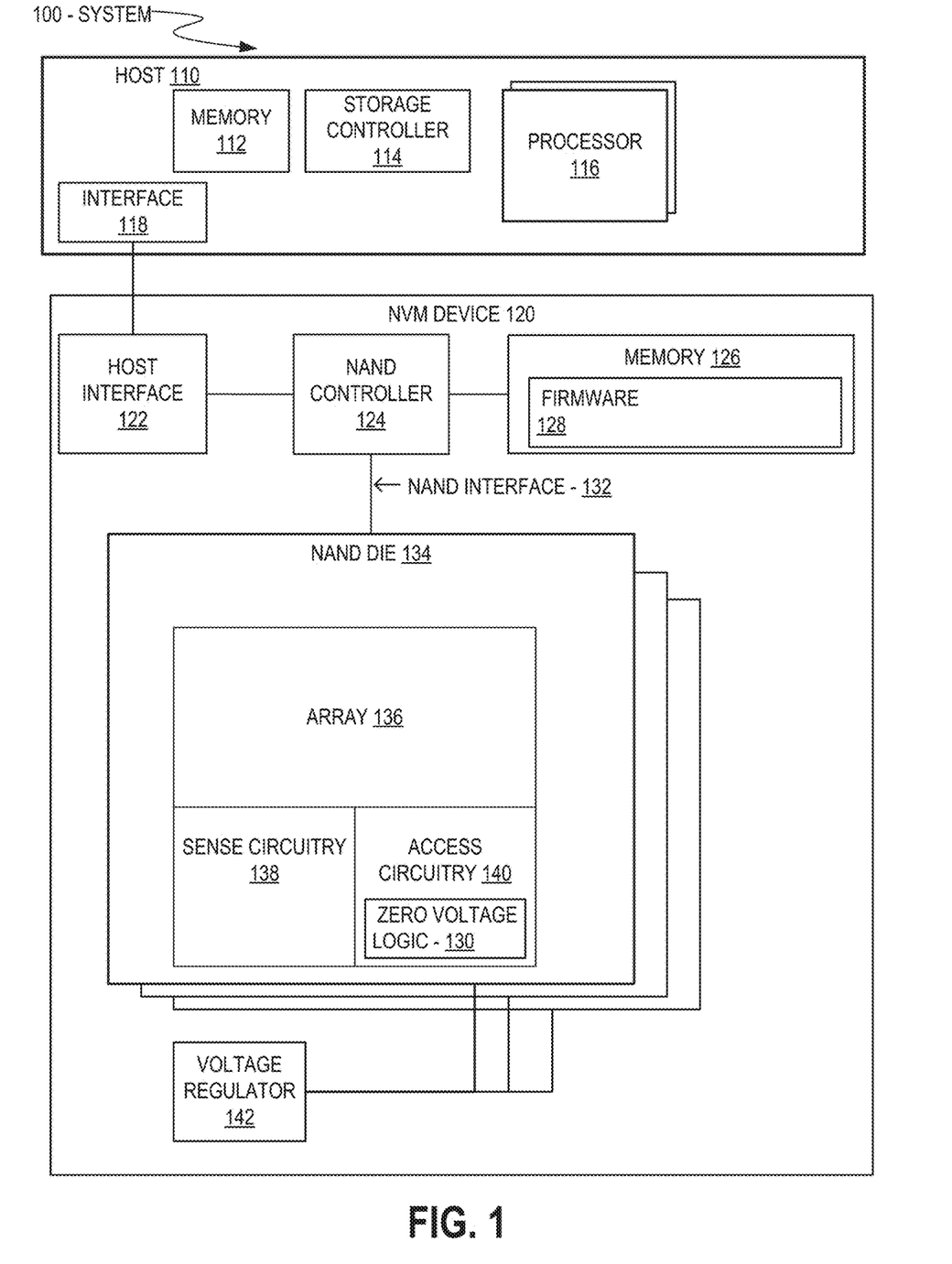
FIG. 1 is a block diagram of selected components of a computer system in which zero voltage program state detection for NAND memory is implemented in accordance with various examples described herein.

FIG. 1 is a block diagram of selected components of a computer system in which zero voltage program state detection for NAND memory can be implemented in accordance with various examples described herein.

The computer system 100 includes a host 110 and non-volatile storage or non-volatile memory (NVM) device 120. The NVM device 120 may be a solid state drive (SSD) or other non-volatile memory device or drive. The host 110 and the NVM device 120 can be an example of a system that exists within the confines of a computer's package (e.g., within a laptop/notebook, server, or other computer). In other examples, the NVM device 120 may be accessed via a larger network such as a local area network (e.g., an Ethernet network), or a wide area network (such as a wireless cellular network, the Internet, etc.), in compliance with a standard such as NVMe-oF (non-volatile memory express over fabrics). The host 110 includes memory 112, a storage controller 114, one or more processors 116 and other components that are omitted from the drawing for clarity.

The NVM device 120 includes one or more memory arrays 136 for storing data. The arrays 136 can be a memory or storage medium that can store one or more bits in memory cells of the arrays. In one example, the arrays 136 include strings of memory cells such as a NAND string (See FIG. 2, infra). In one example, the NVM device 120 includes one or more non-volatile memory dies 134, each divided into multiple planes or groups. Typical NAND dies 134 have multiple planes per die. A plane includes multiple memory cells which may be grouped into blocks.

A block is typically the smallest erasable entity in a NAND die 134. NAND flash memory is typically block-addressable. In one example, a block includes a number of cells that are coupled to the same bitline. A block includes one or multiple pages of cells. The size of the page can vary depending on implementation. In one example, a page has a size of 16 kB. Page sizes of less or more than 16 kB are also possible (e.g., 512B, 2 kB, 4 kB, etc.). Other technologies, such as some NOR flash memory, may be byte addressable for reads and/or writes, and block addressable for erases.

In one embodiment, the array 136 can include memory devices that use multi-threshold level NAND flash memory for storing multiple bits of data per cell, NOR flash memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. For memory devices that use multi-threshold level NAND flash memory, the array 136 can include single-level cell (SLC) NAND storage devices, multi-level cell (MLC) NAND storage devices, triple-level cell (TLC) NAND storage devices, quad-level cell (QLC) storage devices, and/or penta-level cell (PLC) storage devices. As used herein, the term MLC memory collectively refers to TLC, QLC and PLC memories that can store multiple bits of data per cell.

According to some examples, volatile types of memory included in the NVM device 120 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5), HBM2 (HBM version 2), and/or others, and technologies based on derivatives or extensions of such specifications.

The host system 110 communicates with the NVM device 120 using respective interfaces 118 and 122. In one example, the interface 118 is a part of a peripheral control hub (PCH). In the example illustrated in FIG. 1, the host includes a storage controller 114 that is coupled with the NVM device 120 via the interfaces 118/122 to communicate with and control the NVM device 120. In the illustrated example, the NVM device 120 includes a NAND controller 124 that is coupled with a computing platform such as the host 110 via the interfaces 118/122. In one example, the NAND controller 124 is an ASIC (application specific integrated circuit). In one example, the interfaces 118/122 are compliant with a standard such as PCI Express (PCIe), serial advanced technology attachment (ATA), a parallel ATA, universal serial bus (USB), and/or other interface protocol. The NAND controller 124 can communicate with elements of the computing platform host 110 to read data from the NAND dies 134 or write data to the NAND dies 134. Although in this disclosure, the term "host" 110 is referring to a system with one or more processors 116 (or other device sending requests to access data stored in a non-volatile memory) and an interface 118/122 for communicating with the NAND, some implementations of system 100 may refer to the NAND controller 124 as a "host" relative to the NAND dies 134.

The NAND controller 124 can be configured to receive requests from the host 110 via interface 118/122 and generate and perform commands concerning the access of the arrays 136 (e.g., to read data, write, or erase data). Other commands may include, for example, commands to read status, commands to change configuration settings, a reset command, etc. The NAND controller 124 includes control logic that can be implemented with hardware (e.g., circuitry), software, firmware, or a combination of hardware, software and firmware. Examples of logic circuitry include dedicated hardwired logic circuitry (including, e.g., one or more state machine logic circuits), programmable logic circuitry (e.g., field programmable gate array (FPGA), and a programmable logic array (PLA)). In one example, logic circuitry is designed to execute some form of program code such as SSD firmware (e.g., an embedded processor, embedded controller, etc.). The NVM device 120 may include a memory 126 coupled with the NAND controller 124 which can be used to cache data from the non-volatile media and store firmware 128 implementing the control logic executed by the NAND controller 124.

In one embodiment, the NAND controller 124 is coupled with the NAND dies 134 to control or command circuitry on the dies to cause operations to occur (e.g., read, program, erase, suspend, resume, and other operations). Communication between the NAND dies 134 and the NAND controller 124 may include the writing to and/or reading from specific registers. Such registers may reside in the NAND controller 124, on the NAND dies 134, or external to the NAND controller 124 and the NAND dies 134. Registers or memory within the NAND dies 134 may be reachable by the NAND controller 124 by an internal NAND interface 132 between the NAND controller 124 and NAND dies 134 to communicatively couple the NAND controller 124 and the arrays 136.

In one embodiment, the internal NAND interface 132 operates in accordance with the Open NAND Flash Interface Specification (see ONFI Specification, Revision 5.1, May 3, 2022, www.onfi.org/specifications) and/or a proprietary interface or other interface, including an interface that conforms to the Nand Flash Interface Interoperability standard jointly developed by ONFI and JEDEC (see JESD230F, October, 2022, www.jedec.org). Input/output (I/O) pins and signal lines communicatively couple the NAND controller 124 with the NAND dies 134 to enable the transmission of read and write data between the NAND controller 124 and the NAND dies 134. The I/O pins may also be used to transmit other data, such as status information of the dies or planes of the NAND dies 134. The NAND dies 134 can also include other pins such as command pins (e.g., command latch enable (CLE), address latch enable (ALE), chip enable (CE #), read enable (RE #), and write enable (WE #)), and power and ground pins (e.g., Vcc, Vss, etc.).

The NAND dies 134 include access circuitry 140 to control access to the array 136. In one embodiment, the NAND dies 134 are coupled to a voltage regulator circuitry 142 to provide one or more voltages to a sense circuitry 138, the access circuitry 140 and/or array 136. For example, in one embodiment, the access circuitry 140 operates to generate or apply voltages to the array 136 to perform access operations (e.g., read operations, program operations, etc.) based on commands received from the NAND controller 124. The access circuitry 140 on the NAND die 134 is coupled to wordlines of array 136 to select one of the wordlines, apply read reference voltages, apply program voltages combined with bit line potential levels, apply verify voltages, or apply erase voltages. The sense circuitry 138 and access circuitry 140 are coupled to bitlines of array 136 to, among other actions, read data stored in the memory cells of the array 136, determine a state of the memory cells during a program operation, and control potential levels of the bitlines to promote or inhibit programming and erasing.

In one embodiment, the access circuitry 140 includes circuitry to generate a "read waveform," which includes reference voltages to apply to the array at particular times and for particular durations for performing a read operation. Similarly, the access circuitry 140 includes circuitry to generate a "program waveform," including program voltages to apply to the array at particular times and for particular durations for performing a program operation. In the described embodiments, the access circuitry 140 can also include circuitry for a zero voltage logic 130 in which zero voltage program state detection for an array 136 in an NVM device 120 containing NAND memory is implemented in computer system 100 in accordance with various examples described herein.

Figure 2:
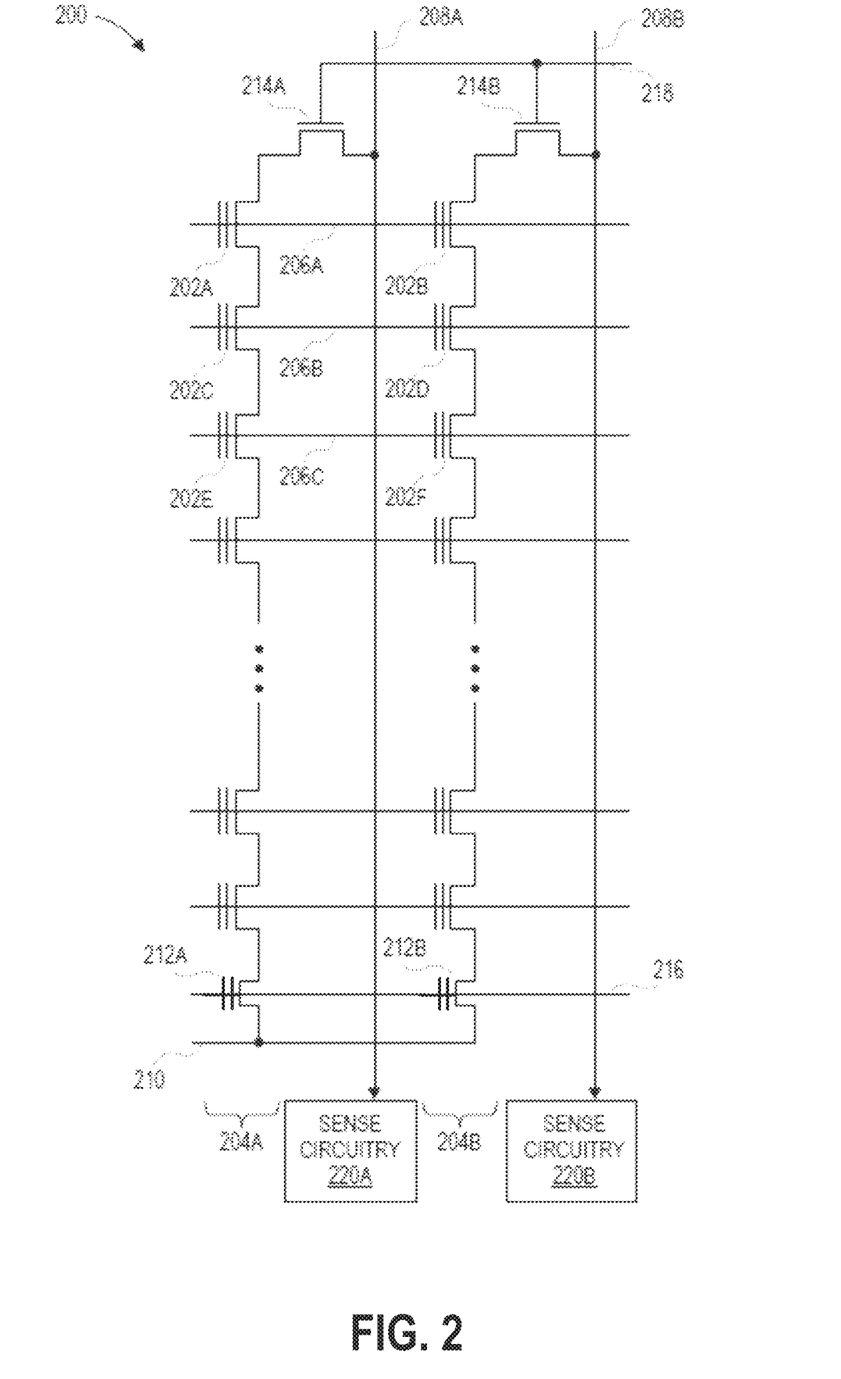
FIG. 2 illustrates depicts an example portion of a NAND flash memory array for which zero voltage program state detection can be implemented in accordance with various examples described herein.

FIG. 2 depicts an example portion of a NAND flash memory array 200/136 for which zero voltage program state detection can be implemented. The NAND flash memory array 200/136 includes multiple non-volatile memory cells 202A-202F (abbreviated as 202) arranged in columns, such as series strings 204A and 204B (abbreviated as 204). In one example, the memory cell 202 includes a transistor with a replacement gate. A cell with a replacement gate typically has a low resistance gate (e.g., a tungsten gate) and a charge trap layer between the gate and the channel where charge is trapped or stored to represent one or more bit values. In another example, a memory cell 202 can include a transistor with a floating gate (e.g., a high resistance poly gate) that stores charge indicative of one or more bit values. Other architectures are also possible. In the series strings 204, drain regions of cells 202 are (with the exception of the top cell) coupled to a source region of another cell 202.

The array 200/136 also includes wordlines 206A-206C. The wordlines 206A-206C can span across multiple series strings 204 (e.g., a wordline may be coupled to one memory cell of each series string 204) and are connected to the control gates of each memory cell 202 of a row of the array 200/136 and used to bias the control gates of the memory cells 202 in the row. The bitlines 208A and 208B (abbreviated as 208) are each coupled to a series string 204 by a drain select gate 214 and sensing circuitry 220A and 220B that detects the state of each cell by sensing voltage or current on a particular bitline 208.

Multiple series strings 204 of the memory cells are coupled to a source line 210 by a source select gate or select-gate-source (SGS) 212A and 212B (abbreviated as 212) and to an individual bitline 208 by a drain select gate or select-gate-drain (SGD) 214A and 214B (abbreviated as 214). The source select gates 212 are controlled by a source select gate control line 216 and the drain select gates 214 are controlled by a drain select gate control line 218.

In some examples, each memory cell 202 can be programmed according to various encoding schemes in accordance with the number of levels of threshold voltage (Vt) for storing one or more bits of data per cell in the device, such as the aforementioned SLC, MLC, TLC, QLC and PLC NAND devices. The threshold voltage is the minimum gate-to-source voltage that is needed to create a conducting path between the source and drain terminals. Each cell's threshold voltage is indicative of the data that is stored in the cell.

In one example, a cell state that is set to store multiple bits of data may form a part of multiple different pages, with each bit of the cell corresponding to a distinct page, where a page is a set of bitlines linked with the same wordline. For example, a page in a 2 Gigabit (Gb) SLC NAND flash die is 2112 bytes (2048 bytes of data and 64 bytes of metadata (including Error Correction Code (ECC) data for the data stored in the page)). An SLC NAND flash die can have 2048 blocks, with each block having 64 pages. Data is read and written (programmed) page by page and erased block by block.

A cell that is to enter a state to store 2 bits (e.g., using an MLC encoding scheme), one bit may correspond to an upper page (UP) and the other bit may correspond to a lower page (LP). For a cell that is to enter a state to store 3 bits (i.e., using a TLC encoding scheme), one bit may correspond to an LP, one bit may correspond to a UP, and the other bit may correspond to an extra page (XP). For a cell that is to store 4 bits (i.e., using a QLC encoding scheme), one bit may correspond to an LP, another bit may correspond to a UP, another bit may correspond to an XP, and the final bit may correspond to a top page (TP). Each page (e.g., LP, UP, XP, or TP) may include an aggregation of corresponding bits stored by a plurality of different cells of a wordline.

In the case of a read operation, particular voltages are applied to the wordlines 206A-206C as well as select gates. The respective charges stored in the cells that are coupled to the activated wordline influence the potential on their respective columns (e.g., "channels") and bitlines which are then sensed with sense circuitry (e.g., the sense circuitry 220A or 220B) to determine the read information (the cells that are not coupled to the activated wordline are electrically isolated from their respective columns).

Figure 3:
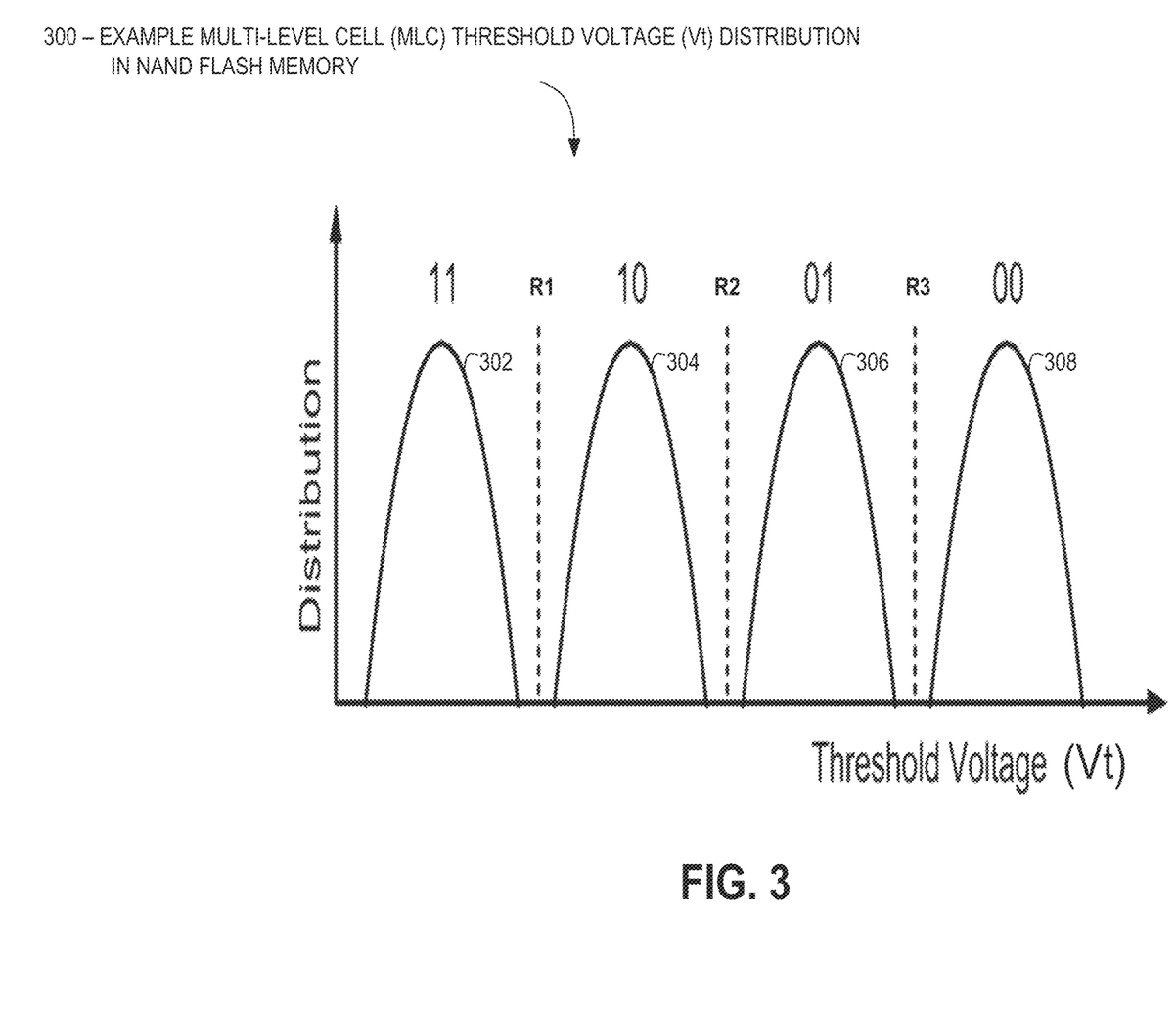
FIG. 3 is a graph illustrating the four voltage regions for two pages (upper page, lower page) in a NAND multi-level memory cell.

FIG. 3 is a graph 300 illustrating four examples of voltage regions 302, 304, 306, 308 (for two pages, upper page and lower page) of MLC NAND flash memory, where a voltage region spans a window of possible threshold voltages (Vt) for the memory cells in the MLC NAND flash memory. As shown, the memory cells are distributed (y-axis) across the voltage regions based on their particular threshold voltage Vt (x-axis). The distribution of the different threshold voltages of the memory cells can vary based on characteristics of the memory cells that can change over time due to, for example, leakage and the wear and tear caused by program/erase cycles. In this example, the threshold voltages of the memory cells follow a Gaussian distribution. Read voltages R1, R2 and R3 are located in the non-overlapping areas between the threshold voltage regions 302, 304, 306, 308. The voltage regions are determined by a lower voltage and an upper voltage (as illustrated by the dashed vertical lines R1, R2 and R3 representing the read voltages at points along the x-axis to the right and/or left of each voltage region). For example, voltage region 304 is delimited by a lower read voltage R1 to the left and an upper read voltage R2 to the right.

During a read operation performed on an MLC NAND flash memory cell, a read reference voltage is applied to the transistor corresponding to the MLC NAND flash memory cell. The threshold voltage of the NAND flash memory cell is compared with the applied read reference voltage to determine the logical two-bit value (00, 01, 10 or 11) represented by the threshold voltage. For example, if the threshold voltage of a memory cell is lower than the applied read reference voltage, the transistor is turned on, and the read operation returns a binary 1 logical value. Otherwise, the read operation returns a binary 0 logical value. In this manner the read operation determines the stored logical value(s) of a NAND flash memory cell.

Programming is achieved by applying a series of program pulses with increasing magnitude to the control gate of the NAND cells in the NAND array. Each program pulse is followed by a series of program verifies to compare the voltage level of the NAND cells against the program verify threshold voltage level. The series of program verifies correspond to the different threshold voltage levels being programmed. In a one-pass programming algorithm, for example, the threshold voltages for all of the levels are programmed in the memory cell using a series of program pulses and program verifies until the desired threshold voltage levels are reached. As other examples, when the cells of a wordline are encoded using a TLC scheme or a QLC scheme, all pages may be programmed during a single programming pass by programming the threshold voltage levels of the cells to the desired program level, or one or more of the pages may be programmed during a first pass and the remaining pages programmed during a second pass (or the remaining pages may be programmed using multiple additional passes).

As noted above, the threshold voltage of the NAND flash memory cell can change, for example, due to program/erase cycling of the flash memory cell (also referred to as endurance), loss of charge (leakage) in the flash memory cell (also referred to as data retention) or interference when a neighboring flash memory cell is programmed (also referred to as read disturb). A change in the threshold voltage of the NAND flash memory cell can result in a read error. For example, an MLC flash memory cell storing a logical two-bit value, as illustrated in FIG. 3, can be misread as storing a different logical two-bit value if the threshold voltage of the memory cell falls outside of the expected threshold voltage region, e.g., 302, 304, 306, 308. Error correcting codes (ECC) can be used to detect and correct bit errors that may occur in the MLC flash memory. In some cases, the read reference voltages can be adjusted, and the read performed (one or more times) using another read reference voltage (also referred to as read retry or moving read reference (MRR) voltage) until the read error is minimized or eliminated using the ECC data.

Figure 4:
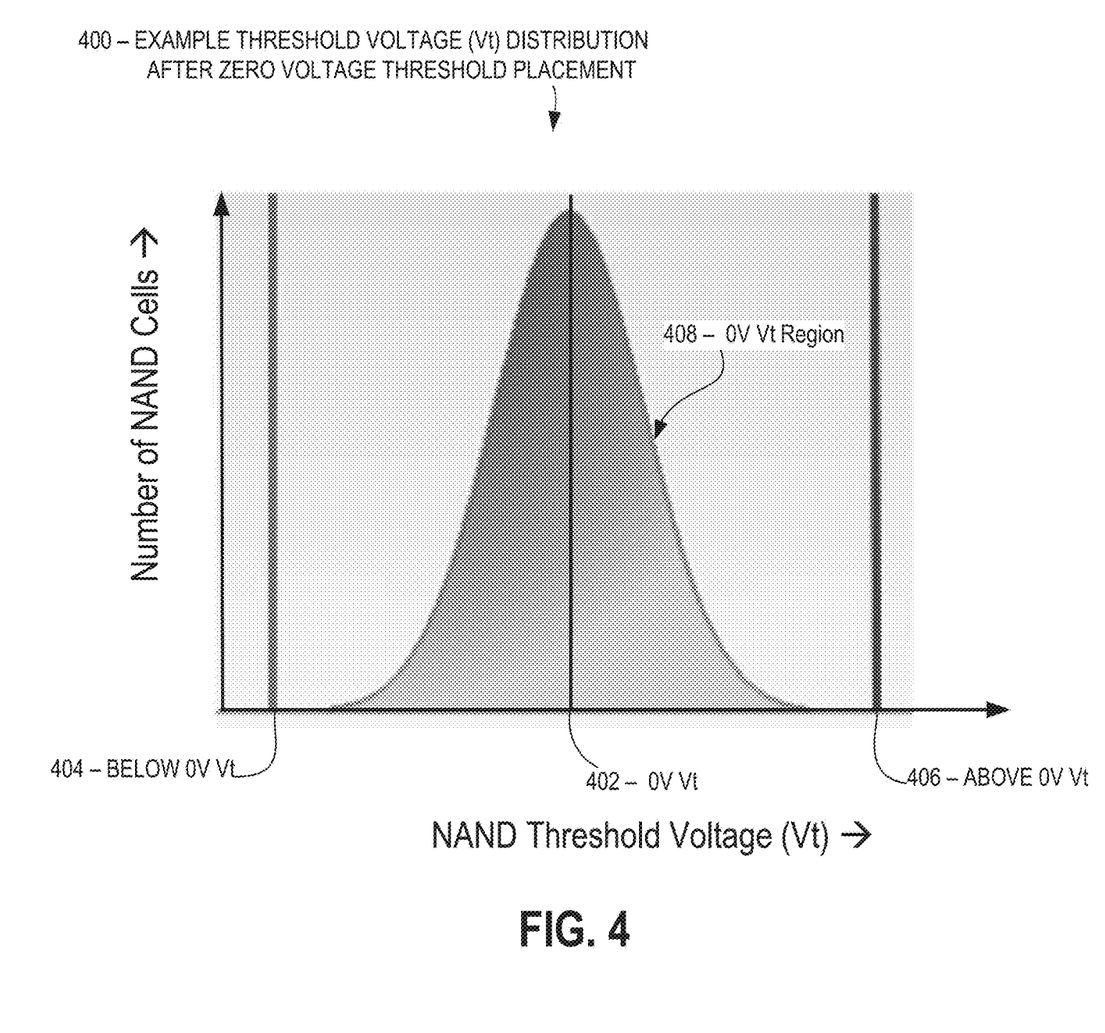
FIG. 4 is a graph illustrating a zero voltage region in a NAND memory cell for which zero voltage program state detection can be implemented in accordance with various examples described herein.

By way of example only, and not limitation, FIG. 4 is a graph 400 illustrating an example zero threshold voltage region 408 in a NAND memory cell in which embodiments of zero voltage program state detection can be implemented. In a preconditioned NAND device that has been placed in a zero voltage program state, the memory cells of the NAND array have been subjected to a complex sequence of commands that erase the NAND device across all decks and force the memory cells to be programmed internally to all zero values at a zero voltage threshold voltage (0V Vt) 402. The zero voltage program state that results is considered to be a neutral state less prone to leakage.

As shown in the example zero threshold voltage region 408 of a preconditioned NAND device, the number of NAND memory cells (y-axis) at each NAND threshold voltage level (x-axis) can be distributed around the zero voltage threshold voltage (0V Vt) 402 in a more or less even distribution. The threshold voltage level that delimits the lowest voltage level below zero at which a NAND memory cell is considered to still be in the zero voltage program state is labeled $V_{BELOW}$ 404. The threshold voltage level that delimits the highest voltage level above zero at which a NAND memory cell is still considered to be in the zero voltage program state is labeled $V_{ABOVE}$ 406. Over time, the distribution may change as the voltage levels of the NAND memory cells change, resulting in an increase in the number of NAND memory cells with threshold voltage levels lower than $V_{BELOW}$ 404 or higher than $V_{ABOVE}$ 406, either of which can cause read errors.

In one embodiment, the range of acceptable voltage levels between $V_{BELOW}$ 404 and $V_{ABOVE}$ 406 is typically considered a proprietary value representing a vendor-specific tolerance for variations in the threshold voltage levels of NAND memory cells placed in a zero voltage program state. By way of example only, and not limitation, a tolerable variation in voltage levels could range from −500 mV to +500 mV. However, the voltage levels that are within the tolerable variation are not necessarily equidistant from the zero voltage threshold voltage (0V Vt) 402. For example, the acceptable voltage levels for memory cells of a preconditioned NAND device placed in a zero program voltage state could range from −500 mV to +400 mV or −400 mV to +500 mV.

In one embodiment, the NAND memory cells in a NAND page that are determined to have threshold voltage levels that fall below or above the range of acceptable voltage levels (i.e., between $V_{BELOW}$ 404 and $V_{ABOVE}$ 406), referred to herein as failing memory cells, are counted to determine the number of bytes that are in error, referred to herein as failed bytes. If a count of the failed bytes exceeds a certain limit, described, infra, as a FAILED BYTES LIMIT (FIG. 5B, 534), then the NAND page can no longer be considered to be in a valid zero voltage program state.

In one embodiment, the FAILED BYTES LIMIT can be a vendor-specific proprietary limit. By way of example only, and not limitation, the certain limit might be 100 bytes, 200 bytes, and so forth, with the exact limit having been predetermined by the vendor based on various characteristics of the NAND memory cells as well as operating characteristics of the device in which the NAND memory cells are being used.

To detect whether NAND memory cells have voltage levels that fall below or above the range of acceptable voltage levels (i.e., between $V_{BELOW}$ 404 and $V_{ABOVE}$ 406), and whether the failed bytes, if any, that result exceeds the FAILED BYTES LIMIT, embodiments of a zero voltage program state detection process can be implemented as detailed in the following process flow diagrams, FIGS. 5A-5B.

Figure 5A:
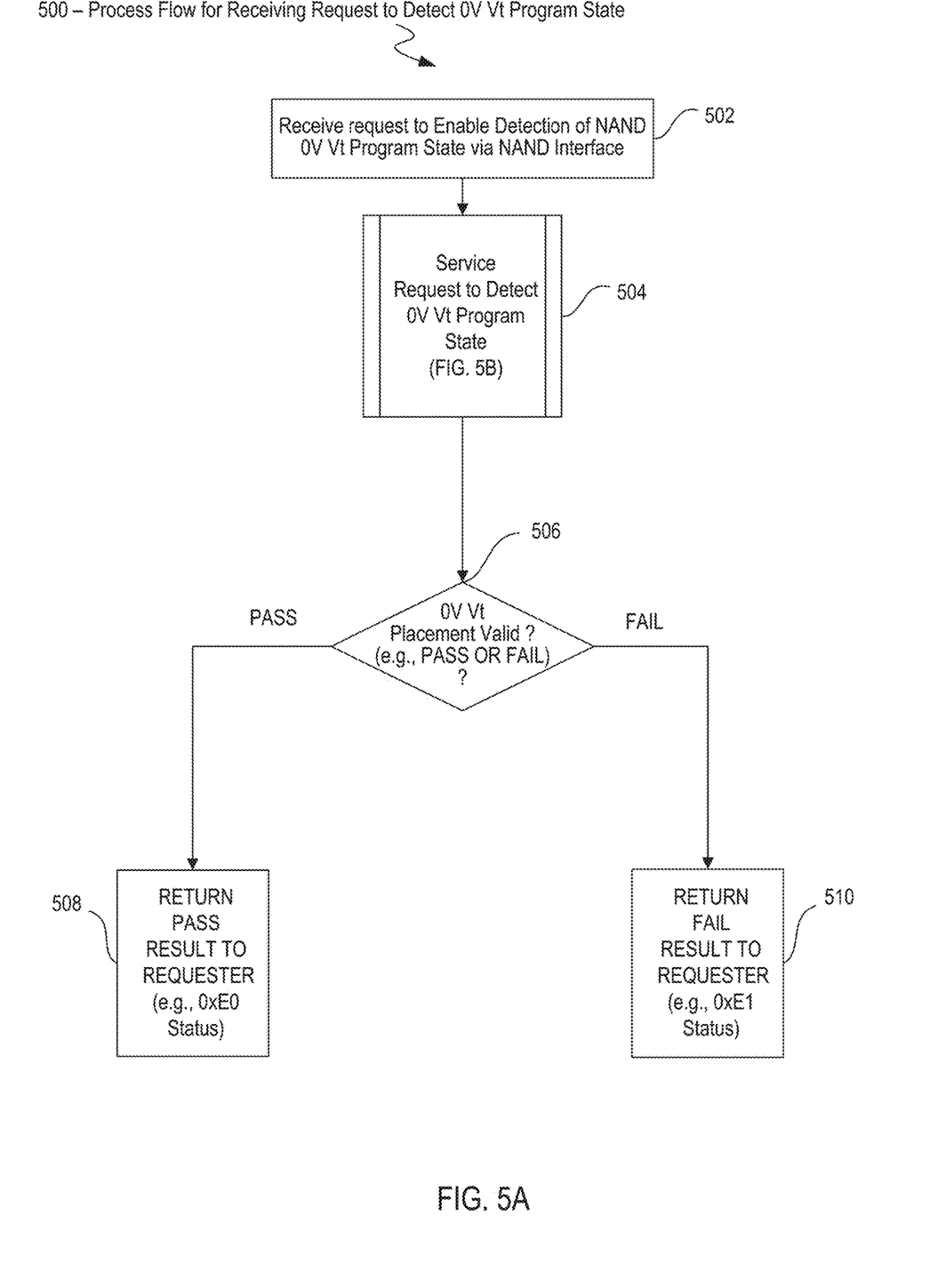
FIGS. 5A-5B are process diagrams illustrating process flows for zero voltage program state detection in accordance with various examples described herein.

By way of example only, and not limitation, FIG. 5A is a process diagram illustrating a process flow 500 for receiving a request to detect a zero voltage program state in accordance with various examples described herein.

In one embodiment, process 500 begins at process block 502 in which a NAND controller (FIG. 1, 124) receives a request via interface (FIG. 1, 118/122) to enable detection of the zero voltage program state. Alternatively, the NAND controller can receive the request by other means. In response, the NAND controller can, in conjunction with a memory and/or firmware (FIG. 1, 126/128) configured to recognize the request, generate a corresponding command, sent to one or more NAND dies (FIG. 1, 134) via a NAND interface (FIG. 1, 132), to initiate detection of the zero voltage program state for one or more NAND pages of a NAND array (FIG. 1, 136) on the respective NAND dies.

Figure 5B:
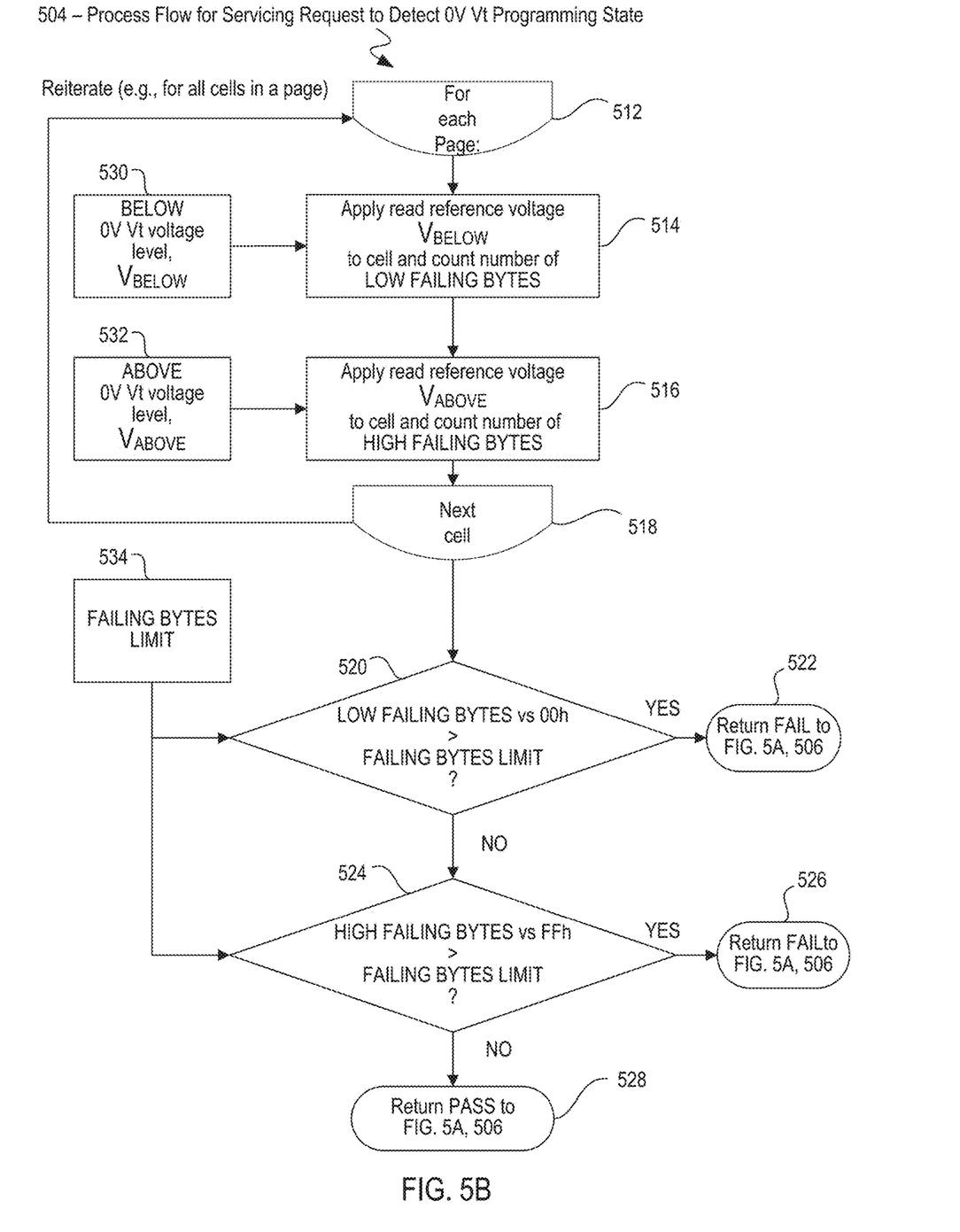
Figure 6:
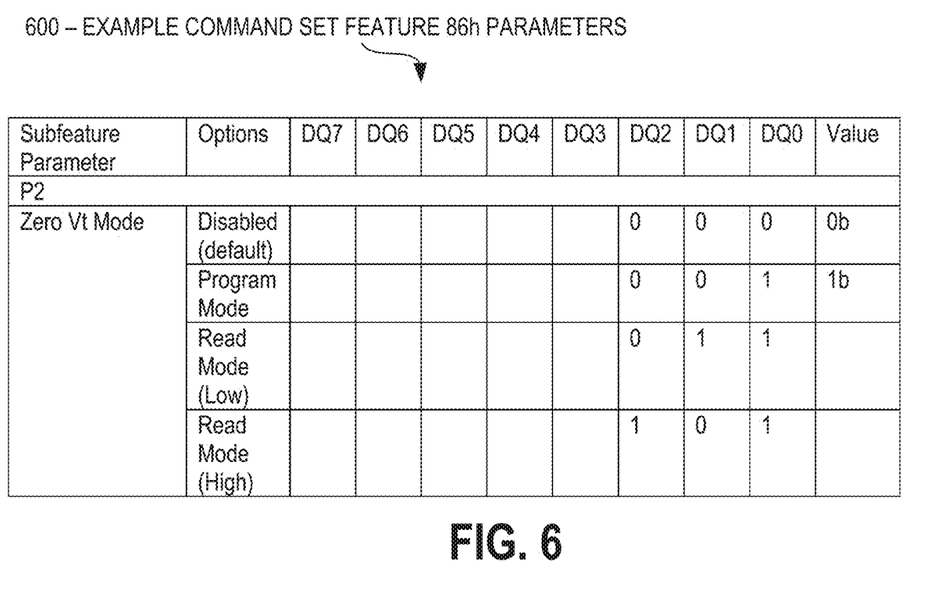
FIG. 6 is a table illustrating an example of a sub-feature parameter, options and signal values for a set feature command to initiate zero voltage program state detection in accordance with various examples described herein.

In one embodiment the command generated by the NAND controller is formatted in accordance with one or more vendor-specific command set feature 86h parameters, such as those described, infra, with reference to FIG. 6. In FIG. 5A, at 504, in response to receiving the command, an access circuitry (FIG. 1, 140) and sense circuitry (FIG. 1, 138) on the NAND die (FIG. 1, 134) operate in conjunction with a zero voltage logic (FIG. 1, 130) to perform processes 504 to service the request to detect the zero voltage program state of one or more pages of the NAND array as further described, infra, in FIG. 5B.

Upon concluding the processes 504 to service the request to detect the zero voltage program state, a decision process 506 determines whether the zero voltage program state of the one or more pages of the NAND array (FIG. 1, 136) is valid, i.e., returned a "PASS" result, or is not valid, i.e., returned a "FAIL" result. In one embodiment, the "PASS" result causes the return of control, at 508, to the requester with a status set to PASS, for example a status value of "0xE0." Likewise, a "FAIL" result causes the return of control, at 510, to the requester with a status set to FAIL, for example a status value of "0xE1."

In a typical operating scenario, a status set to FAIL indicates that that the preconditioning operations to place the NAND memory in a zero voltage program state was missed or skipped due to an error event. Therefore, when there is a return of control to the requester with a status set to FAIL, a user could be instructed to attempt the preconditioning mode again to aid in new product integration (i.e., first use of a new product/debug). Alternatively, a return of control to the requester with a status set to FAIL could also represent a defective block if the cause of the failure is limited to NAND pages in a minority of blocks versus the majority of the blocks on the NAND die. In this operating scenario, a user could be instructed to mark the blocks containing the failed NAND pages as bad.

By way of example only, and not limitation, FIG. 5B is a process diagram illustrating a process flow 504 for servicing a request to detect a zero voltage program state in accordance with various examples described herein. In one embodiment, the processes for servicing the request can reside in the zero voltage logic (FIG. 1, 130) which operates in conjunction with the sense circuitry (FIG. 1, 138) and access circuitry (FIG. 1, 140) in response to receipt of one or more commands generated by the NAND controller.

In one embodiment, the process 504 initiates a process loop at 512 for a page of the NAND array (FIG. 1, 136) undergoing detection. Detection is performed at the page level, and in one embodiment the NAND page represents 16 KB of NAND memory cells.

At 514, the process 504 applies a read reference voltage, $V_{BELOW}$ 530, to the memory cells in the NAND page, where $V_{BELOW}$, described supra (FIG. 4, 404), is a predetermined vendor-specific voltage level below the zero voltage threshold voltage (0V Vt, FIG. 4, 402) of the memory cells after preconditioning. If the threshold voltage of a memory cell is lower than $V_{BELOW}$, the read operation returns a one and the memory cell is determined to be a failing memory cell. The process 504 counts the failing memory cell in a LOW FAILING BYTES fail count for the page. In one embodiment, $V_{BELOW}$ 530 voltage level used during detection can be modified, or tuned, for a given application.

Similarly, at 516, the process 504 applies a read reference voltage, $V_{ABOVE}$ 532, to the memory cells in the NAND page, where $V_{ABOVE}$, described supra (FIG. 4, 406), is a predetermined vendor-specific voltage level above the zero voltage threshold voltage (0V Vt, FIG. 4, 402) of the memory cells after preconditioning. If the threshold voltage of a memory cell is higher than $V_{ABOVE}$, the read operation returns a zero and the memory cell is determined to be a failing memory cell. The process 504 counts the failing memory cell in a HIGH FAILING BYTES fail count for the page. In one embodiment, $V_{ABOVE}$ 532 voltage level can be modified, or tuned, for a given application.

At 518, the process loop 512 is reiterated for each memory cell of the NAND page undergoing zero voltage program state detection. Since the zero voltage program state detection is usually initiated in the context of a first use/storage scenario, the performance of the process loop 512 is not an issue, and a user can request zero voltage program state detection for all NAND pages of a NAND array to provide a complete zero voltage program state detection for a NAND array. Nevertheless, in some scenarios, a user could also request zero voltage program state detection for a smaller sample of NAND pages of a NAND array depending on performance trade-off needs.

In one embodiment, upon completion of the process loop 512 through 518 for each cell in the NAND page, the process 504 performs two separate limit comparisons to a FAILING BYTES LIMIT 534 to determine whether the zero voltage program state of the NAND page is valid.

In one embodiment, the FAILING BYTES LIMIT 534 is an integer value representing a vendor-specific proprietary limit on the number of failed bytes in a NAND page. If the limit is exceeded for failing memory cells whose voltage levels fall below ($V_{BELOW}$ 404) the range of acceptable voltage levels, i.e., the LOW FAILING BYTES, or if the limit is exceeded for failing memory cells above ($V_{ABOVE}$ 406) the range of acceptable voltage levels, i.e., the HIGH FAILING BYTES, the zero voltage program state of the NAND page is detected as invalid. In other words, either limit comparison can result in a fail status for the NAND page undergoing detection, even if only one of the respective low and high failing byte counts exceeds the FAILING BYTES LIMIT 534. In one embodiment, the FAILING BYTES LIMIT 534 can be modified, or tuned, for a given application.

To perform the above-described two separate limit comparisons, the process 504 performs a limit comparison to the FAILING BYTES LIMIT 534 for the LOW FAILING BYTES fail count at decision block 520, and performs another separate limit comparison to the FAILING BYTES LIMIT 534 for the HIGH FAILING BYTES fail count at decision block 524.

In one embodiment, if the LOW FAILING BYTES fail count is greater than the FAILING BYTES LIMIT 534, then the process 504 terminates at 522 and branches back to FIG. 5A, 506, returning a FAIL status. If not, the process 504 continues. At decision block 524, if the HIGH FAILING BYTES fail count is greater than the FAILING BYTES LIMIT 534, then the process 504 terminates at 526 and branches back to FIG. 5A, 506, returning a FAIL status. The FAIL status indicates that the zero voltage program state of the NAND page is invalid.

Lastly, if neither the LOW FAILING BYTES or HIGH FAILING BYTES fail counts exceed the FAILING BYTES LIMIT 534, then the process 504 terminates at 528 and branches back to FIG. 5A, 506, returning a PASS status. The PASS status indicates that the zero voltage program state of the NAND page is valid.

In one embodiment, the separate limit comparisons 520 and 524 may be performed in any order. If either of the fail counts exceeds the FAILING BYTES LIMIT 534, then then the zero voltage program state of the NAND page is invalid as reflected in the return of a FAIL status. Conversely, if neither of the fail counts exceeds the FAILING BYTES LIMIT 534, then the zero voltage program state of the NAND page is valid as reflected in the return of the PASS status.

It should be noted that the flow diagrams as illustrated herein, such as FIGS. 5A-5B, provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

FIG. 6 is a table 600 illustrating an example of sub-feature parameters, options and signal values for a set feature command generated by a NAND controller (FIG. 1, 124) to initiate zero voltage program state detection. As noted with reference to FIG. 5A, the NAND controller can, in conjunction with a memory and/or firmware (FIG. 1, 126/128) generate a command to send to one or more NAND dies (FIG. 1, 134) via a NAND interface (FIG. 1, 132) to initiate detection of the zero voltage program state for one or more NAND arrays (FIG. 1, 136).

In one embodiment, the generated command is formatted in accordance with the Open NAND Flash Interface Specification (see ONFI Specification, Revision 5.1, May 3, 2022, www.onfi.org/specifications). In table 600, the generated command includes one or more vendor-specific command set feature 86h options located in sub-feature P2 in the DQ0, DQ1 and DQ2 locations of the command that are transferred on the lower 8-bits of the data bus. For example, as shown in FIG. 6, table 600, to enable zero voltage program state detection (the program mode option), the DQ0 bit location is set to "1." The two read operations (Read Mode Low and Read Mode High) for reading the memory cells at $V_{BELOW}$ and $V_{ABOVE}$ to detect the zero voltage program state are enabled in the DQ1 and DQ2 bit locations.

In other embodiments, the generated command can be formatted in accordance with a proprietary format that is not part of a standard interface specification.

Figure 7:
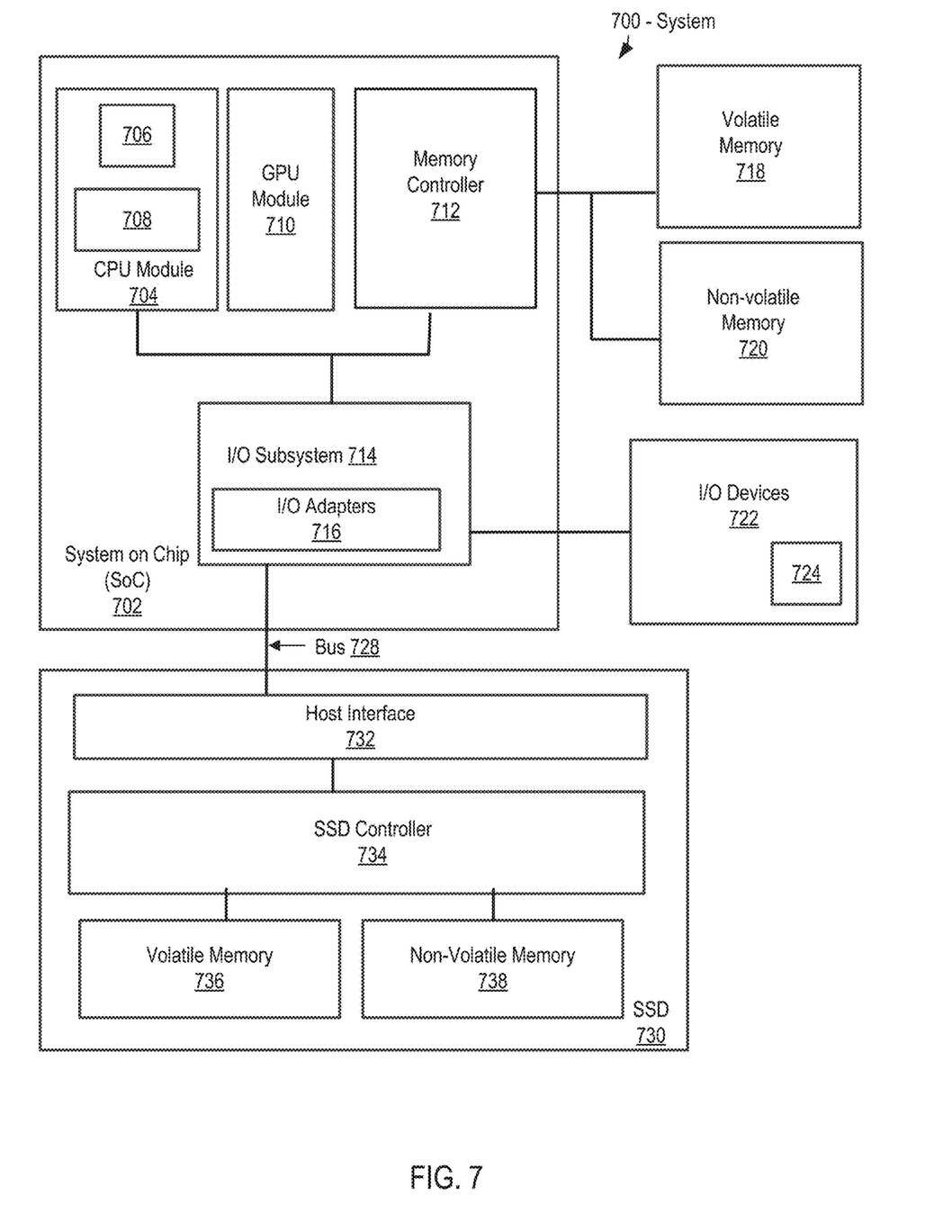
FIG. 7 is a block diagram of an embodiment of a computer system that includes a memory controller and non-volatile memory in which zero voltage program state detection may be implemented in accordance with various examples described herein.

FIG. 7 is a block diagram of an embodiment of a system 700 including, but not limited to, a server, a workstation computer, a desktop computer, a laptop computer, and/or a tablet computer. The computer system 700 includes a system on chip (SOC or SoC) 702 which combines processor, graphics, memory, and Input/Output (I/O) control logic into one SoC package. The SoC 702 includes at least one Central Processing Unit (CPU) module 704, a memory controller 712 in communication with a volatile memory 718 and non-volatile memory 720 that includes one or more non-volatile memory devices, and a Graphics Processor Unit (GPU) 710. Volatile memory 718 is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). In other embodiments, the memory controller 712 can be external to the SoC 702. The CPU module 704 includes at least one processor core 706, and a level 2 (L2) cache 708 and an operating system software that manages computer hardware and software including memory allocation and access to I/O devices. Examples of operating systems include Microsoft® Windows®, Linux®, iOS® and Android®.

Although not shown, each of the processor core(s) 706 can internally include one or more instruction/data caches, execution units, prefetch buffers, instruction queues, branch address calculation units, instruction decoders, floating point units, retirement units, etc. The CPU module 704 can correspond to a single core or a multi-core general purpose processor, such as those provided by Intel® Corporation, according to one embodiment.

The Graphics Processor Unit (GPU) 710 can include one or more GPU cores and a GPU cache which can store graphics related data for the GPU core. The GPU core can internally include one or more execution units and one or more instruction and data caches. Additionally, the Graphics Processor Unit (GPU) 710 can contain other graphics logic units that are not shown in FIG. 7, such as one or more vertex processing units, rasterization units, media processing units, and codecs.

Within the I/O subsystem 714, one or more I/O adapter(s) 716 are present to translate a host communication protocol utilized within the processor core(s) 706 to a protocol compatible with particular I/O devices. Some of the protocols that adapters can be utilized for translation include Peripheral Component Interconnect Express (PCIe); Universal Serial Bus (USB); Serial Advanced Technology Attachment (SATA) and Institute of Electrical and Electronics Engineers (IEEE) 1594 "Firewire".

The I/O adapter(s) 716 can communicate with external I/O devices 722 which can include, for example, user interface device(s) including a display and/or a touch-screen display 724, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe, NVMe (NVM Express) over PCIe, and SATA over bus 728 to a host interface 732 in the SSD 730. NVMe standards define a register level interface for host software to communicate with a non-volatile memory subsystem, for example, an SSD over PCIe or a high-speed serial computer expansion bus. The NVMe standards are available at www.nvmexpress.org. The PCIe standards are available at www.pcisig.com.

The I/O adapter(s) 716 can also communicate with an SSD 730 which includes an SSD controller 734, a host interface 732 and a non-volatile memory 738 that includes one or more non-volatile memory devices. The I/O adapter(s) 716 can also communicate with a volatile memory 736 in SSD 730.

Additionally, there can be one or more wireless protocol I/O adapters 716. Examples of wireless protocols, among others, are used in personal area networks, such as IEEE 802.15 and Bluetooth, 4.0; wireless local area networks, such as IEEE 802.11-based wireless protocols; and cellular protocols.

Additional example implementations are as follows:

Example 1 is a method, system, apparatus or computer-readable medium for zero voltage program state detection in a non-volatile memory (NVM) device comprising a NAND array of memory cells and circuitry to detect a status of a zero voltage program state of a NAND page of the NAND array. The circuitry can access failing memory cells in the NAND page whose voltage levels are not within an acceptable range of voltage levels below and above a zero threshold voltage, count the failing memory cells in a failed bytes counter, and return the status of the zero voltage program state based on the failed bytes counter, including a fail status if the failed bytes counter exceeds a failed bytes limit, and a pass status if the failed bytes counter does not exceed the failed bytes limit.

Example 2 is the method, system, apparatus or computer-readable medium of Example 1 in which to access failing memory cells whose voltage levels are not within the acceptable range, the circuitry is to apply a threshold voltage below ($V_{BELOW}$) the zero threshold voltage to access failing memory cells whose voltage levels are below the acceptable range, and apply a threshold voltage above ($V_{ABOVE}$) the zero threshold voltage to access failing memory cells whose voltage levels are above the acceptable range.

Example 3 is the method, system, apparatus or computer-readable medium of any of Examples 1 and 2 in which the $V_{BELOW}$ is a lowest voltage level in the acceptable range, the $V_{ABOVE}$ is a highest voltage level in the acceptable range, and the acceptable range is a predetermined range of millivolts below and above the zero threshold voltage.

Example 4 is the method, system, apparatus or computer-readable medium of any of Examples 1, 2 and 3, in which to count the failing memory cells in the failed bytes counter, the circuitry is further to count low failed bytes for the failing memory cells whose voltage levels are below the acceptable range count high failed bytes for the failing memory cells whose voltage levels are above the acceptable range, and return the fail status if any of: the low failed bytes exceeds the failed bytes limit and the high failed bytes exceeds the failed bytes limit.

Example 5 is the method, system, apparatus or computer-readable medium of any of Examples 1, 2, 3 and 4, in which the failed bytes limit is a predetermined limit on a maximum count of failed bytes in the NAND page of the NAND array, above which the circuitry is to return the fail status.

Example 6 is the method, system, apparatus or computer-readable medium of any of Examples 1, 2, 3, 4 and 5, in which the circuitry to detect the status of the zero voltage program state is reiterated for each memory cell in one or more NAND pages of the NAND array.

Example 7 is the method, system, apparatus or computer-readable medium of any of Examples 1, 2, 3, 4, 5 and 6, further comprising a NAND controller, and further in which the circuitry is to detect a status of a zero voltage program state of a NAND page of the NAND array responsive to receiving a command from the NAND controller enabling a zero threshold voltage mode in the circuitry.

Example 8 is the method, system, apparatus or computer-readable medium of any of Examples 1, 2, 3, 4, 5, 6 and 7, in which the NAND array is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell, and the NAND page includes any one of: a lower ("LP"), upper ("UP"), extra ("XP") of the TLC NAND, and a lower ("LP"), upper ("UP"), extra ("XP") and top ("TP") page of the QLC NAND.

Example 9 is a method, system, apparatus or computer-readable medium for zero voltage program state detection in a NAND storage device comprising a storage array of NAND memory cells and a logic to determine a zero voltage program state of a page of the storage array. For each NAND memory cell in a page of the NAND memory cells, the logic is to apply any one of a lowest voltage level and a highest voltage level of an acceptable range of voltage levels for a zero threshold voltage to access failing NAND memory cells whose voltage levels are not within the acceptable range, count failing NAND memory cells in a failed bytes counter, and determine that the zero voltage program state of the page of the storage array is invalid if the failed bytes counter exceeds a failed bytes limit and valid if the failed bytes counter does not exceed the failed bytes limit.

Example 10 is the method, system, apparatus or computer-readable medium of Example 9 in which to count the failing NAND memory cells in the failed bytes counter, the logic is to compute a low failed bytes count for failing NAND memory cells whose voltage levels are below the acceptable range, compute a high failed bytes count for failing NAND memory cells whose voltage levels are above the acceptable range, and determine that the zero voltage program state of the page is invalid if any one of the low failed bytes count and the high failed bytes count exceeds the failed bytes limit, and valid if neither of the low failed bytes count and the high failed bytes count exceeds the failed bytes limit.

Example 11 is the method, system, apparatus or computer-readable medium of any of Examples 9 and 10 in which wherein the acceptable range of voltage levels for a zero threshold voltage is a predetermined range of voltage levels below and above a zero voltage level, the predetermined range including voltage levels millivolts below and above a zero voltage level.

Example 12 is the method, system, apparatus or computer-readable medium of any of Examples 9, 10 and 11 in which the failed bytes limit is a predetermined limit on a maximum count of failed bytes in the page of the NAND memory cells, above which the zero voltage program state of the page is invalid.

Example 13 is the method, system, apparatus or computer-readable medium of any of Examples 9, 10, 11 and 12 further comprising a NAND interface to the storage array of NAND memory cells, and further in which the logic to determine the zero voltage program state of the page of the storage array is performed responsive to a command received from the NAND interface, the command formatted in accordance with a standard specification for the NAND interface, including an Open NAND Flash Interface Specification.

Example 14 is the method, system, apparatus or computer-readable medium of any of Examples 9, 10, 11, 12 and 13, in which the storage array of NAND memory cells is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell, and further in which the page of the storage array of NAND memory cells includes any one of: a lower ("LP"), upper ("UP"), extra ("XP") of the TLC NAND, and a lower ("LP"), upper ("UP"), extra ("XP") and top ("TP") page of the QLC NAND.

Example 15 is a method, system, apparatus or computer-readable medium for zero voltage program state detection comprising a processor coupled with an NVM device having a NAND die containing a storage array of NAND memory cells and an access circuitry on the NAND die, responsive to a request received from the processor, to determine a zero voltage program state of a page of the storage array. For each NAND memory cell in a page of the storage array, the access circuitry is to apply any one of a lowest voltage level and a highest voltage level of an acceptable range of voltage levels for a zero threshold voltage to access failing NAND memory cells whose voltage levels are not within the acceptable range, count failing NAND memory cells in a failed bytes counter, an determine that the zero voltage program state of the page of the storage array is invalid if the failed bytes counter exceeds a failed bytes limit and valid if the failed bytes counter does not exceed the failed bytes limit.

Example 16 is the method, system, apparatus or computer-readable medium of Example 15, in which to count the failing NAND memory cells in the failed bytes counter, the access circuitry is to compute a low failed bytes count for failing NAND memory cells whose voltage levels are below the acceptable range, compute a high failed bytes count for failing NAND memory cells whose voltage levels are above the acceptable range and determine that the zero voltage program state of the page is invalid if any one of the low failed bytes count and the high failed bytes count exceeds the failed bytes limit and valid if neither of the low failed bytes count and the high failed bytes count exceeds the failed bytes limit.

Example 17 is the method, system, apparatus or computer-readable medium of any of Examples 15 and 16, in which the acceptable range of voltage levels for a zero threshold voltage is a predetermined range of voltage levels below and above a zero voltage level, the predetermined range including voltage levels millivolts below and above a zero voltage level.

Example 18 is the method, system, apparatus or computer-readable medium of any of Examples 15, 16 and 17, in which the failed bytes limit is a predetermined limit on a maximum count of failed bytes in the page of the NAND memory cells, above which the zero voltage program state of the page is invalid.

Example 19 is the method, system, apparatus or computer-readable medium of any of Examples 15, 16, 17 and 18, further comprising a NAND interface to the NAND die in which the request from the processor is formatted into a command transmitted to the access circuitry via the NAND interface in accordance with a standard specification for the NAND interface, including an Open NAND Flash Interface Specification.

Example 20 is the method, system, apparatus or computer-readable medium of any of Examples 15, 16, 17, 18 and 19, in which the storage array of NAND memory cells is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell, and further in which the page of the storage array of NAND memory cells includes any one of a lower ("LP"), upper ("UP"), extra ("XP") of the TLC NAND and a lower ("LP"), upper ("UP"), extra ("XP") and top ("TP") page of the QLC NAND.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A non-volatile memory (NVM) device comprising:
a NAND array of memory cells; and
circuitry to detect a status of a zero voltage program state of a NAND page of the NAND array, in which the memory cells are programmed internally to all zero values at a zero threshold voltage, the circuitry to:

access failing memory cells in the NAND page whose voltage levels are not within an acceptable range of voltage levels below and above a zero threshold voltage, count the failing memory cells in a failed bytes counter, and return the status of the zero voltage program state based on the failed bytes counter, including:
a fail status if the failed bytes counter exceeds a failed bytes limit, and
a pass status if the failed bytes counter does not exceed the failed bytes limit.

2. The NVM device as in claim 1, wherein to access the failing memory cells whose voltage levels are not within the acceptable range, the circuitry is to:
apply a threshold voltage below ($V_{BELOW}$) the zero threshold voltage to access failing memory cells whose voltage levels are below the acceptable range; and
apply a threshold voltage above ($V_{ABOVE}$) the zero threshold voltage to access failing memory cells whose voltage levels are above the acceptable range.

3. The NVM device as in claim 2, wherein:
the $V_{BELOW}$ is a lowest voltage level in the acceptable range;
the $V_{ABOVE}$ is a highest voltage level in the acceptable range; and
wherein the acceptable range is a predetermined range of millivolts below and above the zero threshold voltage.

4. The NVM device as in claim 1, wherein to count the failing memory cells in the failed bytes counter, the circuitry is further to:
count low failed bytes for the failing memory cells whose voltage levels are below the acceptable range;
count high failed bytes for the failing memory cells whose voltage levels are above the acceptable range; and
return the fail status if any of:
the low failed bytes exceeds the failed bytes limit, and
the high failed bytes exceeds the failed bytes limit.

5. The NVM device as in claim 1, wherein the failed bytes limit is a predetermined limit on a maximum count of failed bytes in the NAND page of the NAND array, and the circuitry is to return the fail status if the failed bytes counter exceeds the predetermined limit on the maximum count of failed bytes.

6. The NVM device as in claim 1, where the circuitry to detect the status of the zero voltage program state is reiterated for each memory cell in one or more NAND pages of the NAND array.

7. The NVM device as in claim 1, further comprising:
a NAND controller; and
wherein the circuitry is to detect a status of the zero voltage program state of the NAND page of the NAND array responsive to receiving a command from the NAND controller enabling a zero threshold voltage mode in the circuitry.

8. The NVM device as in claim 1, wherein:
the NAND array is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell; and
the NAND page includes any one of:
a lower ("LP"), upper ("UP"), extra ("XP") of the TLC NAND, and a lower ("LP"), upper ("UP"), extra ("XP") and top ("TP") page of the QLC NAND.

9. A NAND storage device comprising:
a storage array of NAND memory cells in which the NAND memory cells are programmed internally to all zero values at a zero threshold voltage; and
a logic to determine a zero voltage program state of a page of the storage array, the logic to:
for each of the NAND memory cells in the page of the NAND memory cells, apply any one of a lowest voltage level and a highest voltage level of an acceptable range of voltage levels for a zero threshold voltage to access the failing NAND memory cells whose voltage levels are not within the acceptable range,
count failing NAND memory cells in a failed bytes counter, and
determine the zero voltage program state of the page of the storage array:
is invalid if the failed bytes counter exceeds a failed bytes limit, and
is valid if the failed bytes counter does not exceed the failed bytes limit.

10. The NAND storage device as in claim 9, wherein, to count the failing NAND memory cells in the failed bytes counter, the logic is to:
compute a low failed bytes count for the failing NAND memory cells whose voltage levels are below the acceptable range;
compute a high failed bytes count for the failing NAND memory cells whose voltage levels are above the acceptable range; and
determine the zero voltage program state of the page:
is invalid if any one of the low failed bytes count and the high failed bytes count exceeds the failed bytes limit, and
is valid if neither of the low failed bytes count and the high failed bytes count exceeds the failed bytes limit.

11. The NAND storage device as in claim 9, wherein the acceptable range of voltage levels for the zero threshold voltage is a predetermined range of voltage levels below and above a zero voltage level, the predetermined range including voltage levels millivolts below and above the zero voltage level.

12. The NAND storage device as in claim 9, wherein the failed bytes limit is a predetermined limit on a maximum count of failed bytes in the page of the NAND memory cells, and the zero voltage program state of the page is invalid if the failed bytes counter exceeds the predetermined limit on the maximum count of failed bytes.

13. The NAND storage device as in claim 9, further comprising:
a NAND interface to the storage array of the NAND memory cells; and
wherein the logic to determine the zero voltage program state of the page of the storage array is performed responsive to a command received from the NAND interface, the command formatted in accordance with a standard specification for the NAND interface, including an Open NAND Flash Interface Specification.

14. The NAND storage device as in claim 9, wherein:
the storage array of the NAND memory cells is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell; and the page of the storage array of NAND memory cells includes any one of:
- a lower ("LP"), upper ("UP"), extra ("XP") of the TLC NAND, and
- a lower ("LP"), upper ("UP"), extra ("XP") and top ("TP") page of the QLC NAND.

15. A system comprising:

a processor coupled with an NVM device having a NAND die containing a storage array of NAND memory cells in which the NAND memory cells are programmed internally to all zero values at a zero threshold voltage; and an access circuitry on the NAND die, responsive to a request received from the processor, to determine a zero voltage program state of a page of the storage array including:
- for each of the NAND memory cells in the page of the storage array, apply any one of a lowest voltage level and a highest voltage level of an acceptable range of voltage levels for a zero threshold voltage to access failing NAND memory cells whose voltage levels are not within the acceptable range,
  - count the failing NAND memory cells in a failed bytes counter, and
  - determine the zero voltage program state of the page of the storage array:
    - is invalid if the failed bytes counter exceeds a failed bytes limit, and
    - is valid if the failed bytes counter does not exceed the failed bytes limit.

16. The system as in claim 15, wherein to count the failing NAND memory cells in the failed bytes counter, the access circuitry is to:
- compute a low failed bytes count for the failing NAND memory cells whose voltage levels are below the acceptable range;
- compute a high failed bytes count for the failing NAND memory cells whose voltage levels are above the acceptable range; and
- determine the zero voltage program state of the page:
  - is invalid if any one of the low failed bytes count and the high failed bytes count exceeds the failed bytes limit, and
  - is valid if neither of the low failed bytes count and the high failed bytes count exceeds the failed bytes limit.

17. The system as in claim 15, wherein the acceptable range of voltage levels for a zero threshold voltage is a predetermined range of voltage levels below and above a zero voltage level, the predetermined range including voltage levels millivolts below and above a zero voltage level.

18. The system as in claim 15, wherein the failed bytes limit is a predetermined limit on a maximum count of failed bytes in the page of the NAND memory cells, and the zero voltage program state of the page is invalid if the failed bytes counter exceeds the predetermined limit on the maximum count of failed bytes.

19. The system as in claim 15, further comprising:
- a NAND interface to the NAND die, wherein the request from the processor is formatted into a command transmitted to the access circuitry via the NAND interface in accordance with a standard specification for the NAND interface, including an Open NAND Flash Interface Specification.

20. The system as in claim 15, wherein:

the storage array of the NAND memory cells is a multi-level cell NAND flash memory capable of storing multiple bits of data per cell, including any one of a Triple Level Cell (TLC) NAND storing three bits of data per cell, a Quad Level Cell (QLC) NAND storing four bits of data per cell, and a Penta Level Cell (PLC) NAND storing five bits of data per cell; and the page of the storage array of NAND memory cells includes any one of:
- a lower ("LP"), upper ("UP"), extra ("XP") of the TLC NAND, and
- a lower ("LP"), upper ("UP"), extra ("XP") and top ("TP") page of the QLC NAND.

* * * * *